United States Patent [19]

Roehrlein

[11] Patent Number: 5,027,069
[45] Date of Patent: Jun. 25, 1991

[54] CIRCUIT ARRANGEMENT FOR A GRADIOMETER HAVING SUPERCONDUCTING QUANTUM INTERFEROMETER (SQUID) FOR MEASURING LOW-INTENSITY BIOMAGNETIC FIELDS

[75] Inventor: Gerhard Roehrlein, Hoechstadt, Fed. Rep. of Germany

[73] Assignee: Siemens Aktiengesellschaft, Munich, Fed. Rep. of Germany

[21] Appl. No.: 481,130

[22] Filed: Feb. 20, 1990

[30] Foreign Application Priority Data

Mar. 1, 1989 [EP] European Pat. Off. ........ 89103585.9

[51] Int. Cl.$^5$ ........................................... G01R 33/035
[52] U.S. Cl. ..................................... 324/248; 307/309; 324/225
[58] Field of Search ............... 324/225, 244, 248, 260; 307/306, 309

[56] References Cited

U.S. PATENT DOCUMENTS

| | | | |
|---|---|---|---|
| 4,315,215 | 2/1982 | Onodera et al. | 324/248 |
| 4,389,612 | 6/1983 | Simmonds et al. | 324/248 |
| 4,749,946 | 6/1988 | Hoenig | 324/248 |

FOREIGN PATENT DOCUMENTS 2115552  9/1983  United Kingdom .

OTHER PUBLICATIONS

"Instruments & Experimental Techniques"; by Lobotka et al, vol. 30, No. 3, part 2, pp. 673-677, Plenum Pub. Corp., N.Y.
Biomagnetism, "An Interdisciplinary Approach, Series A: Life Sciences", vol. 66, Plenum Press, New York, 1983 by S. N. Erné, pp. 69-85 and pp. 265-275.
Drung, D., Digital Feedback Loops for d.c. SQUIDS, Cryogenics, vol. 26, Nov. 1986, pp. 623-627.

Primary Examiner—Gerard R. Strecker
Attorney, Agent, or Firm—Hill, Van Santen, Steadman & Simpson

[57] ABSTRACT

Circuit arrangement for a gradiometer with super conducting quantum interferometer (SQUID) for measuring low-intensity biomagnetic fields. In the circuit arrangement a modulated output voltage that is proportional to a measured magnetic field is supplied to an analog-to-digital converter for digitization and quantization, a modulated output signal of the analog-to-digital converter serving as a digital measured signal.

3 Claims, 2 Drawing Sheets

CIRCUIT ARRANGEMENT FOR A GRADIOMETER HAVING SUPERCONDUCTING QUANTUM INTERFEROMETER (SQUID) FOR MEASURING LOW-INTENSITY BIOMAGNETIC FIELDS

BACKGROUND OF THE INVENTION

The present invention is directed to a circuit arrangement for a gradiometer having a superconducting quantum interferometer (SQUID) for measuring low-intensity biomagnetic fields. A pick-up current generated by a gradiometer coil in the gradiometer and which is a function of the intensity of the measured magnetic field is supplied to an in-coupling element which additively mixes the pick-up current with a modulation current generated by a modulation voltage generator. It also subtractively mixes the pick-up current with a feedback current and supplies a resultant current to the SQUID as an input quantity which amplitude-modulates the resultant current with the modulation current and thereby provides a modulated output signal to a demodulator as a modulated voltage via a first bandpass filter. The demodulator multiplies the modulated voltage by a first modulation voltage from a first modulation generator which is phase-shifted by 90° to provide a demodulated voltage and supplies the demodulated voltage via an amplifier to a low-pass filter whose output signal is supplied to the in-coupling element as the feedback current.

U.S. Pat. No. 4,749,946 discloses measuring equipment of this type for measuring biomagnetic fields on the order of magnitude of 0.1 pT through about 50.0 pT that can be performed in one-channel fashion or in multi-channel fashion. Such measuring equipment are usually composed of a gradiometer of a first or higher order and of a superconducting quantum interferometer (SQUID) electrically cooperating therewith in a circuit arrangement as schematically shown, for example, in the following publications; "Biomagnetism: 'An Interdisciplinary Approach', Series A: Life Sciences", Vol. 66, Plenum Press, New York, 1983, Chapter 4.5, and Erne' S.N., "The SQUID in the 'Flux-Locked-Loop'", pages 81-83. A circuit arrangement of this type in analog technology particularly has the disadvantage that imprecisions, especially due to a drifting D.C. voltage offset of a final amplifier, appear in the measurement of low constant magnetic fields.

In order to avoid these imprecisions, prior art solutions have attempted to compensate for the errors caused by the drifting D.C. voltage offset of, in particular, the amplifiers with complex analog circuits. For example, such a solution is described in the publications; "Biomagnetism: 'An Interdisciplinary Approach', Serial A: Life Sciences", Vol. 66, Plenum Press, New York, 1983, Chapter 9.4, and Cohen, D., "Steady Fields of the Heart", pages 265-274.

SUMMARY OF THE INVENTION

An object of the present invention is to provide a less complicated circuit arrangement wherein the aforementioned offset error does not occur.

This object is achieved by a circuit arrangement of the type initially described in which the modulated output signal of the first bandpass filter is supplied to an analog-to-digital converter for digitization and quantization, a demodulated output signal of the analog-to-digital converter for digitization and quantization, a demodulated output signal of the analog-to-digital converter being a measured signal after passing through a low-pass filter. The present invention provides that the dominating offset error that comes from the final amplifier arrangement outside of the control loop is eliminated. The offset drift of the amplifier that still remains within the control loop is reduced to such an extent by the feedback control circuit that it lies within the measuring tolerance. A partially digital control loop of this type is disclosed in the publication, "Cryogenics", Vol. 26, No. 11, 1986 "Digital Feedback Loops For D.C. SQUIDs, pages 623-627, wherein, however, the digital signal is again converted into an analog signal that then serves as a feedback signal and as a measured signal. The improvement provided by the present invention, however, cannot be achieved with this prior art device because the final amplifier is situated outside of the digital circuit.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures in which like reference numerals identify like elements, and in which:

DESCRIPTION OF THE PREFERRED EMBODIMENT

Figure 1:
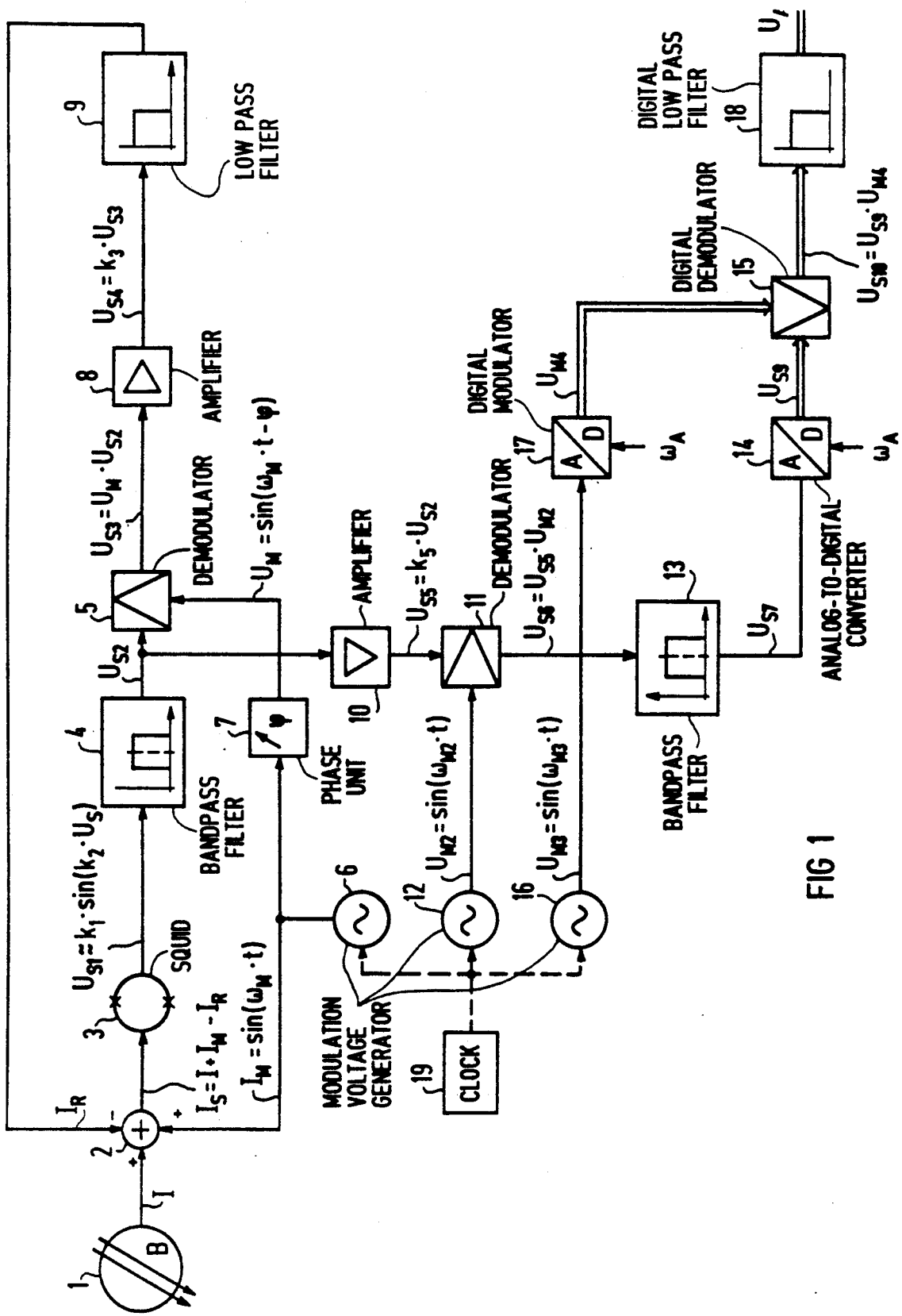
FIG. 1 is a circuit block diagram of the present invention having analog-to-digital conversion of a measured signal with free sampling frequency of the analog-to-digital converters.

In the circuit arrangement shown In FIG. 1, the magnetic field B to be measured penetrates the pick-up coil 1 of a gradiometer which generates a corresponding current I that is supplied to an in-coupling element 2. A feedback current $I_R$ is subtracted from the current I of the pick-up coil 1 in the in-coupling element 2 and a modulation current $I_M$ is added to the current I. The modulation current $I_M$ is thereby proportional to the modulation voltage $U_M = \sin(\Omega_M \cdot t)$ generated by a modulation voltage generator. This modulation current $I_M = \sin(\Omega_M \cdot t)$ is proportional to the modulation voltage $U_M = \sin(\Omega_M = \sin(\Omega_M \cdot t))$ generated by a modulation voltage generator 6. A resultant aggregate current $I_S = I + I_M - I_R$ results at the output of the in-coupling element 2. This aggregate current $I_S$ is supplied to a SQUID 3 that acts as a current-to-voltage converter and at whose output an alternating voltage $U_{S1} \approx k_1 \cdot \sin(k_2 \cdot U_S)$ is produced. This alternating voltage is received by a bandpass filter 4 which filters out of the frequency mix a frequency band having the limit values $\Omega_1$ and $\Omega_2$. The modulated alternating voltage $U_{S2}$ on the output of this bandpass filter 4 is supplied to a demodulator stage 5. For demodulating the voltage $U_{S2}$, the modulation voltage $U_{M = \sin(\Omega_M \cdot t - \gamma)}$, generated by the modulation voltage generator 6 and phase-rotated by 90° by the phase unit 7, is supplied to the demodulator stage 5. The demodulated voltage $U_{S3} = U_M \cdot U_{S2}$ at the output of the demodulator stage 5 is supplied to an amplifier 8. The amplifier 8 outputs a voltage $U_{S4}=k_3 \cdot U_{S3}$ which is supplied to a low-pass filter 9 whose output current $I_R$ is fed back to the in-coupling element 2 as a feedback current. The voltage $U_{S2}$ at the output of the bandpass filter 4 is simultaneously supplied to an amplifier 10 and is supplied to a demodulator stage 11 as amplified voltage $U_{S5}=k_5 \cdot U_{S2}$. The voltage $U_{S5}$ is converted into an intermediate frequency voltage $U_{S6}=U_{S5} \cdot U_{M2}$ using a modulation voltage $U_{M2}=\sin(\Omega_{M2} \cdot t)$ generated by a modulation voltage generator 12 and is supplied to a bandpass filter 13. The voltage $U_{S7}$ having the frequency band $$\left(\omega_{M3} - \frac{\omega B}{2}\right) \text{ to } \left(\omega_{M3} + \frac{\omega B}{2}\right)$$

is provided on an output of the bandpass filter 13 and is supplied to an analog-to-digital converter 14 that digitizes this voltage $U_{S7}$ with the frequency $\Omega_A$ and converts it into a digital voltage $U_{S9}$. The digital voltage $U_{S9}$ is supplied to a digital demodulator 15. The demodulation occurs using a voltage $U_{M4}$ that is also digitized and which is acquired by digitizing an analog alternating voltage $U_{M3}=\sin(\Omega_{M3} \cdot t)$ generated by a modulation voltage generator 16, being acquired with a sampling frequency $\Omega_A$ in the digital modulator 17. The digitized alternating voltage $U_{S10}=U_{S9} \cdot U_{M4}$ is produced at the output of the digital demodulator 15. This voltage $U_{S10}$ is supplied to a digital low-pass filter 18 at whose output the digital measured voltage $U_A$ is produced which is a representation of the magnetic field B measured by the pick-up coil 1.

The modulation voltage generators 6, 12 and 16 are synchronized by a clock 19. The following relationships exist between the frequencies of the alternating voltages generated by the modulation voltage generators 6, 12 and 16 and the limit frequencies of the bandpass filter stages:

$\omega_M > \omega_B; \omega_B = \omega_2 - \omega_1; \omega_{M3} = \omega_M - \omega_{M2};$ $\frac{\omega B}{2} < \omega_{M3} < \omega_{M2} < \omega_M$ and $\omega_A \geq 2 \cdot \left(\omega_{M3} + \frac{\omega B}{2}\right).$ $\Omega_M$ is thereby the frequency of the alternating voltage $U_M$ or respectively, of the alternating current $I_M$ generated by the modulation voltage generator 6;

$$\frac{\omega B}{2}$$

is the limit frequency of the low-pass filter 9 as well as of the digital low-pass filter 18; $\Omega_{M2}$ is the frequency of the voltage $U_{M2}$ generated by the modulation voltage generator 12; $\Omega_{M3}$ is the frequency of the alternating voltage $U_{M3}$ generated by the modulation voltage generator 16; and $\Omega_A$ is the sampling frequency of the analog-to-digital converters 14, 17.

Figure 2:
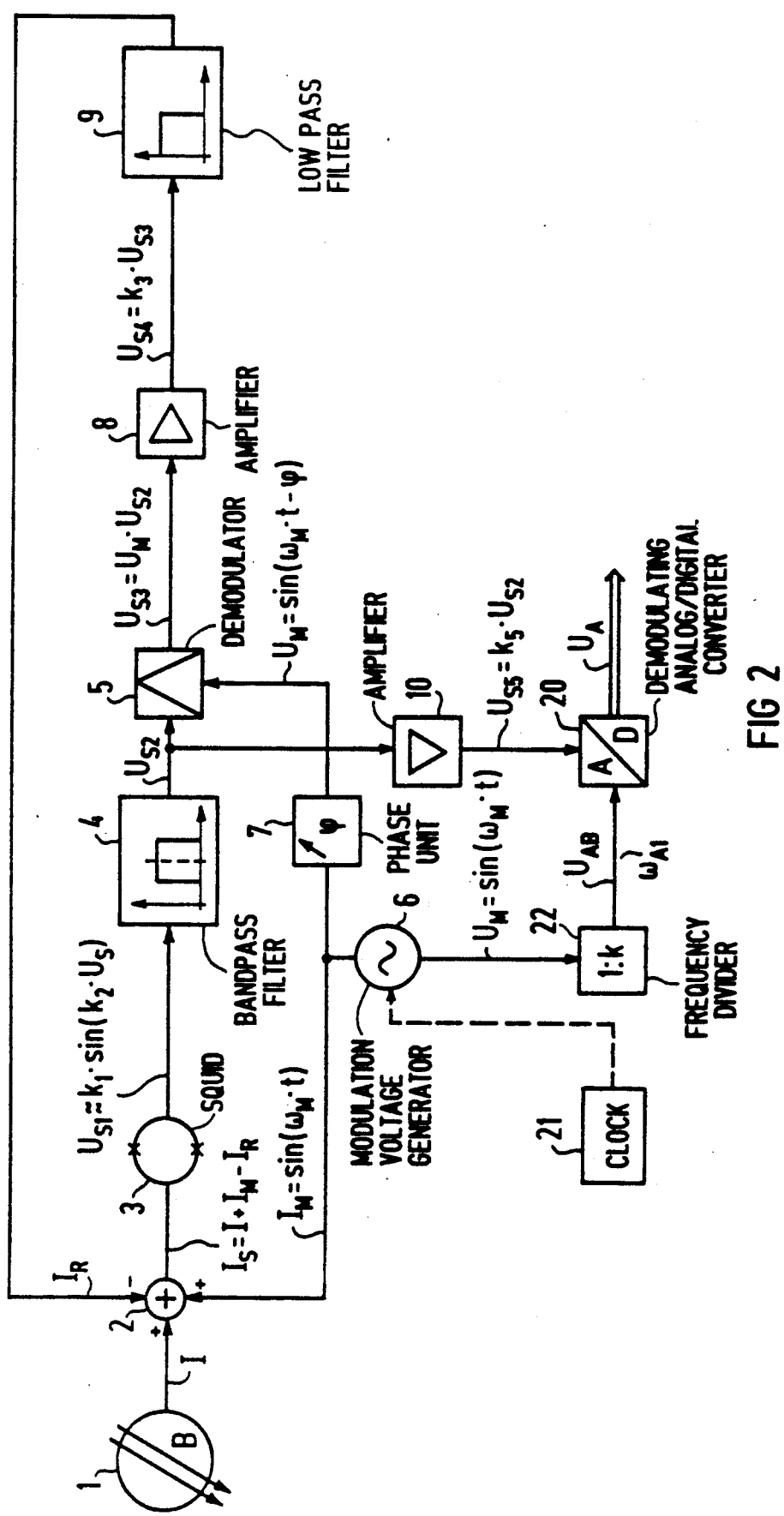
FIG. 2 is a block diagram depicting a modification of the FIG. 1 circuit using a sampling frequency of the analog-to-digital converter which is synchronized with the modulation frequency.

FIG. 2 shows a circuit arrangement which is a modification of the FIG. 1 circuit. Circuit elements referenced with reference numerals 1 through 10 have the same function as the corresponding circuit elements in the arrangement of FIG. 1. Deviating from the circuit arrangement of FIG. 1, however, the output voltage of the amplifier 10, $U_{S5}=k_5 \cdot U_{S2}$, is directly supplied to a demodulating analog-to-digital converter 20. The demodulating analog-to-digital converter 20 receives its sampling frequency $\Omega_{A1}$ from the alternating voltage of the modulation voltage generator 6 that is synchronized by a clock 21. The modulation voltage $U_M=\sin(\Omega_M \cdot t)$ generated by the modulation voltage generator 6 is supplied to a frequency divider 22 that divides the frequency $\Omega_M$ by a factor k and supplies the corresponding output voltage $U_{AB}$ to the demodulating analog-to-digital converter 20 as a sampled signal $\Omega_{A1}$. The latter forms the digitized measured voltage $U_A$ therefrom. The following relationships thereby derive between the frequencies of the alternating voltage generated by the modulation voltage generator 6 and the limit frequencies of the filters $S_9$: $\Omega_B=\Omega_2-\Omega_1$; $\Omega_M=k \cdot \Omega_{A1}$ and $\Omega_{A1}>\Omega_B$. The factor $$\frac{\omega B}{2}$$

is thereby the limit frequency of the filter stage 9; $\Omega_1$ and $\Omega_2$ are the limit values of the bandpass filter 4; and $\Omega_{A1}$ is the sampling frequency of the demodulating analog-to-digital converter 20.

Compared to the circuit arrangement of FIG. 1, the circuit arrangement of FIG. 2 has the advantage that no digital low-pass filter is required because no undesired spectral components arise in the analog-to-digital conversion. The prerequisite for the functioning of this circuit, however, is that the modulation signal $U_M$ is coupled phase-locked with the modulation frequency $\Omega_M$ and the sampling signal $U_{AB}$ is coupled phase-locked to the sampling frequency $\Omega_{A1}$.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. In a circuit arrangement for a gradiometer having a superconducting quantum interferometer (SQUID) for measuring low-intensity biomagnetic fields, whereby a pick-up current generated by a gradiometer coil in the gradiometer and which is a function of the intensity of the measured magnetic field is supplied to an in-coupling element which additively mixes the pick-up current with a modulation current generated by a first modulation voltage generator and subtractively mixes the pick-up current with a feedback current and inputs a resultant current to the SQUID which thereby provides a modulated output signal to a demodulator as a modulated voltage via a first bandpass filter, the demodulator multiplying the modulated voltage by a first modulation voltage from said first modulation generator which is phase-shifted by 90° to provide a demodulated voltage and supplying the demodulated voltage via an amplifier to a low-pass filter whose output signal is supplied to the in-coupling element as the feedback current, the improvement comprising the modulated output signal of the first bandpass filter being supplied to an analog-to-digital converter for digitization and quantization, a demodulated output signal of the analog-to-digital converter being a measured signal after passing through a digital low-pass filter, the modulated output voltage of the first bandpass filter conducted to the analog-to-digital converter as an input voltage, the output voltage of the analog-to-digital converter being supplied to a digital demodulator that digitally demodulates this output voltage with a digitized, further modulation voltage generated by a further modulation voltage generator operating synchronously with the first modulation voltage generator and the demodulated voltage being supplied to said digital low-pass filter whose output signal is the measured signal.

2. The arrangement according to claim 1, wherein the modulated output voltage of the first bandpass filter is conducted via an amplifier to a demodulator stage that provides an analog intermediate frequency voltage using a second modulation voltage generated by a second modulation voltage generator that operates synchronously with the first modulation voltage generator, the intermediate frequency voltage being supplied via a second bandpass filter to the analog-to-digital converter as the input voltage.

3. In a circuit arrangement for a gradiometer having a superconducting quantum interferometer (SQUID) for measuring low-intensity biomagnetic fields, whereby a pick-up current generated by a gradiometer coil in the gradiometer and which is a function of the intensity of the measured magnetic field is supplied to an in-coupling element which additively mixes the pick-up current with a modulation current generated by a first modulation voltage generator and subtractively mixes the pick-up current with a feedback current and inputs a resultant current to the SQUID which thereby provides a modulated output signal to a demodulator as a modulated voltage via a first bandpass filter, the demodulator multiplying the modulated voltage by a first modulation voltage from said first modulation generator which is phase-shifted by 90° to provide a demodulated voltage and supplying the demodulated voltage via an amplifier to a low-pass filter whose output signal is supplied to the in-coupling element as the feedback current, the improvement comprising the modulated output signal of the first bandpass filter being supplied to an analog-to-digital converter for digitization and quantization, a demodulated output signal of the analog-to-digital converter being a measured signal after passing through a digital low-pass filter, the modulated output voltage of the bandpass filter supplied via an amplifier to the analog-to-digital converter that operates as a digital demodulator and to which a sampling voltage is coupled phase-locked with the modulation voltage, the sampling voltage being generated by at least the first modulation voltage generator and having a frequency which is a whole divisor of the modulation voltage frequency, the digitized output voltage of the analog-to-digital converter being the measured signal.

* * * * *